United States Patent [19]
Takaishi

[11] Patent Number: 5,903,430
[45] Date of Patent: May 11, 1999

[54] DYNAMIC RANDOM ACCESS MEMORY CELL HAVING AN IMPROVED FIN-STRUCTURED STORAGE ELECTRODE

[75] Inventor: Yoshihiro Takaishi, Tokyo, Japan

[73] Assignee: NEC Corporation, Tokyo, Japan

[21] Appl. No.: 08/831,001

[22] Filed: Mar. 31, 1997

[30] Foreign Application Priority Data

Mar. 29, 1996 [JP] Japan .................................. 8-076090

[51] Int. Cl.$^6$ ............................ H01G 4/30; H01L 27/108
[52] U.S. Cl. ..................... 361/301.4; 361/303; 361/329; 257/303; 257/307; 257/308
[58] Field of Search ................................. 361/301.4, 303, 361/306.3, 311–313, 321.2, 321.3, 329; 257/300, 303, 306–307, 308, 309, 310, 532, 908, 900; 365/145, 149, 182

[56] References Cited

U.S. PATENT DOCUMENTS

| | | | |
|---|---|---|---|
| 5,142,639 | 8/1992 | Kohyama et al. ....................... | 257/306 |
| 5,160,987 | 11/1992 | Pricer et al. .............................. | 257/307 |
| 5,206,787 | 4/1993 | Fujoka ...................................... | 257/307 |
| 5,573,967 | 11/1996 | Tseng ....................................... | 438/254 |
| 5,661,061 | 8/1997 | Usuami et al. .......................... | 438/254 |
| 5,696,395 | 12/1997 | Tseng ....................................... | 257/308 |
| 5,701,264 | 12/1997 | Shrivastava et al. ................... | 365/149 |
| 5,835,337 | 11/1998 | Watanabe et al. ..................... | 361/301.4 |

OTHER PUBLICATIONS

T. Ema et al., "3–Dimensional Stacked Capacitor Cell For 16M and 64M Drams", pp. 592–595, IEDM 88, IEEE 1988.

Primary Examiner—Kristine Kincaid
Assistant Examiner—Anthony Dinkins
Attorney, Agent, or Firm—Young & Thompson

[57] ABSTRACT

The present invention provides a capacitor comprising: a semiconductor substrate; an inter-layer insulator formed over the silicon substrate; at least two interconnections formed within the inter-layer insulator, the two interconnections being distanced at a pitch in a lateral direction; a fin-structured storage electrode comprising a vertically extending column portion and a plurality of fins, each of which laterally and radially extends from the vertically extending column portion, the fins being spaced in a vertical direction and the vertically extending column portion extending through the inter-layer insulator to a surface of the semiconductor substrate and also extending upwardly from a surface of the inter-layer insulator, wherein the vertically extending column portion is smaller in diameter within the inter-layer insulator and larger in diameter over the inter-layer insulator; a capacitive insulation film formed on a surface of the fin-structured storage electrode; and an opposite electrode formed on the capacitive insulation film.

8 Claims, 6 Drawing Sheets

DYNAMIC RANDOM ACCESS MEMORY CELL HAVING AN IMPROVED FIN-STRUCTURED STORAGE ELECTRODE

BACKGROUND OF THE INVENTION

The present invention relates to a semiconductor memory device, and more particularly to a dynamic random access memory cell having an improved fin-structured storage electrode and a method of fabricating the same.

Generally, the dynamic random access memory cell has a pair of a transfer field effect transistor and a memory cell capacitor. This simple structure of the dynamic random access memory cell is suitable for high integration of the dynamic random access memory device. There has been developed a memory cell capacitor having a three dimensional structure for further increase in the density of the integration of the memory cell array in the dynamic random access memory device.

Namely, in the light of the scale reduction of the memory cell and increase in the density of the integration of the memory cell array, it is required to reduce an occupied area of the memory cell capacitor and ensure a large capacitance necessary for allowing the dynamic random access memory device to show stable operations and has a reliance on operations thereof, for the purpose of which it is further necessary to increase in surface area of a memory cell capacitor storage electrode as much as possible.

The three dimensional structured memory cell capacitor is classified into two types. First one is the stacked memory cell capacitor and second one is the trench memory cell capacitor. The stacked memory cell capacitor has a high resistivity to noises due to alpha-ray incidence or circuits, for which reason the stacked memory cell capacitor is capable of performing stable operations even if the capacitance of the stacked memory cell capacitor is relatively small. Generally, it seems considered that the stacked memory cell capacitor is available to 0.15 micrometers scale rule for 1 Gbit dynamic random access memory device.

As one of the stacked memory cell capacitors, various fin-structured memory cell capacitors have been proposed and, for example, disclosed in INTERNATIONAL ELECTRON DEVICES MEETING, 1988 pp. 593–595, entitled "3-DIMENSIONAL STACKED CAPACITOR CELL FOR 16M AND 64M DRAMS", and also disclosed in the Japanese laid-open patent publication No. 5-291524. The fin-structure is effective to increase the surface area of the memory cell capacitor storage electrode. In order to obtain a further increase in the surface area of the fin-structured storage electrode of the stacked memory cell capacitor, it is effective to increase the number of fins of the storage electrode. Since each fin comprises a conductive layer, if the number of the fines of the storage electrode is increased, then the mechanical strength of the fin structure of the storage electrode of the memory cell capacitor is reduced whereby the conductive film forming each fin may be curved. As a result, the reliability of performances of the fin structured storage electrode of the stacked memory cell capacitor is reduced. In the Japanese laid-open patent publication No. 5-291524, it is disclosed to strengthen the fin structure of the storage electrode of the memory cell capacitor. The fin-structured storage electrode of the stacked memory cell capacitor may be fabricated in accordance with a method to be described below with reference to FIGS. 1A through 1E which are fragmentary cross sectional elevation views illustrative of a conventional fin-structured storage electrode of the stacked memory cell capacitor.

With reference to FIG. 1A, a first silicon oxide film 52 is formed as an inter-layer insulator over a silicon substrate 51. A first silicon nitride film 53 is formed over the first silicon oxide film 52. The first silicon nitride film 53 will serve as an etching stopper to etchant of hydrofluoric acid in later process to be described below. A second silicon oxide film 54 is formed over the first silicon nitride film 53. A second silicon nitride film 55 is then formed over the second silicon oxide film 54. A first polysilicon film 56 is then formed over the second silicon nitride film 55. A third silicon oxide film 57 is formed over the first polysilicon film 56. A third silicon nitride film 58 is further formed over the third silicon oxide film 57. A second polysilicon film 59 is then formed over the third silicon nitride film 58. A fourth silicon oxide film 60 is then formed over the second polysilicon film 59. A fourth silicon nitride film 61 is then formed over the fourth silicon oxide film 60.

With reference to FIG. 1B, a contact hole 62 is formed, which vertically extends from the fourth silicon nitride film 61 to the first silicon oxide film 52 so that a part of the silicon substrate 51 is shown through the contact hole 62.

With reference to FIG. 1C, a third polysilicon film 63 is entirely formed over the fourth silicon nitride film 61 and within the contact hole 62 so that the silicon substrate 51 is made into contact with the polysilicon film 63.

With reference to FIG. 1D, the laminations of the second silicon nitride film 55, the first polysilicon film 56, the third silicon oxide film 57, the third silicon nitride film 58, the second polysilicon film 59, the fourth silicon oxide film 60, the fourth silicon nitride film 61 and the third polysilicon film 63 are subjected to an anisotropic etching to pattern the same.

With reference to FIG. 1E, by use of a hydrofluoric acid solution is used to carry out a wet etching or an isotropic etching to etching the second silicon oxide film 54, the third silicon oxide film 57 and the fourth silicon oxide film 60, wherein the first silicon nitride film 53, the second silicon nitride film 55, the third silicon nitride film 58 and the fourth silicon nitride film 61 serve as etching stoppers thereby to form a fin-structured storage capacitor electrode 64 over the silicon substrate 51. The first polysilicon film 56 serves as a first conductive layer of the fin-structured storage capacitor electrode 64. The first conductive layer is supported by the second silicon nitride film 55. The second polysilicon film 59 serves as a second conductive layer of the fin-structured storage capacitor electrode 64. The second conductive layer is supported by the third silicon nitride film 58. The third polysilicon film 63 serves as a third conductive layer of the fin-structured storage capacitor electrode 64. The third conductive layer is supported by the fourth silicon nitride film 61. In this case, the fin-structured storage electiode has three fins. Notwithstanding, it is possible to increase the number of fins of the fin-structured storage electrode in order to increase the surface area of the fin-structured storage electrode.

As described above, the second silicon nitride film 55, the third silicon nitride film 58 and the fourth silicon nitride film 61 serve as the supporting layers for supporting the three fins of the first, second and third conductive layers of the fin-structured storage electrode in order to prevent the three fins of the first, second and third conductive layers from being curved or bent to contact with each other. However, the supporting layers of the second, third and fourth silicon nitride films 55, 58 and 61 make it difficult to reduce the thickness of a capacitive insulation film covering the fin-structured storage electrode. The reduction in the thickness of the capacitive insulation film of the fin-structured storage electrode is essential to increase the capacitance of the fin-structured storage electrode, for which reason the difficulty in reduction in the thickness of the capacitive insulation film of the fin-structured storage electrode makes it difficult to increase the capacitance of the fin-structured storage electrode.

In order to settle the above problem, it is required to remove the second, third and fourth silicon nitride films 55, 58 and 61 by a wet etching or an isotropic etching. Since the etching rate of the silicon nitride film is low, a relatively long time is necessary for removal of the second, third and fourth silicon nitride films 55, 58 and 61 by the wet etching or the isotropic etching. In the light of mass productions, it is not suitable to increase the number of fins of the fin-structured storage electrode.

In order to increase the surface area of the fin-structured storage electrode, it is effective to increase a lateral length by which each of the fins extends laterally and outwardly from a column portion of the third polysilicon film. Namely, the lateral length of the fins is long as compared to a diameter of the contact hole 62. In order to increase the lateral length of the fins of the fin-structured storage electrode, it is needed to provide the silicon nitride films which support the conductive films serving as the fins and also prevent the fins from being curved or bent.

If, however, the diameter of the contact hole 62 is increased whilst the lateral length of the fins is reduced, then this suppress the fins from being bent even without support by the silicon nitride films. It is however impossible to decide the diameter of the contact hole without consideration of a pitch of low level interconnections, for example, word lines or bit lines. In other word, the diameter of the contact hole is decided by the pitch of the low level interconnections, for example, word lines or bit lines. In the light of increase in the density of the integration of the memory cell arrays or a possible reduction of the occupied area of the memory cell, it is required to set as narrow as possible the pitch of the low level interconnections, for example, word lines or bit lines. In order to obtain a maximum density of the integration or a minimum occupied area of the memory cell, it is required to set the pitch of the low level interconnections, for example, word lines or bit lines at the minimum scale. The diameter of the contact hole is required to be not larger than the pitch of the low level interconnections, for example, word lines or bit lines in order to prevent any short circuit. If, however, the diameter of the contact hole is larger than the pitch of the low level interconnections, for example, word lines or bit lines, then the contact hole is made into contact with the word lines or bit lines.

On the other hand, if the diameter of the contact hole is so small as compared to the lateral length of the fins, then the fin-structured storage electrode is likely to fall down or peel off.

In the above circumstances, it had been required to develop a novel fin-structured storage capacitor of the stacked memory cell capacitor free from the problems as described above and provide a novel method of fabricating the same.

SUMMARY OF THE INVENTION

Accordingly, it is an object of the present invention to provide a novel fin-structured storage electrode of a stacked capacitor memory cell capacitor, which is free from the problems as described above.

It is a further object of the present invention to provide a novel fin-structured storage electrode of a stacked capacitor memory cell capacitor, which has a reduced occupied area.

It is a still further object of the present invention to provide a novel fin-structured storage electrode of a stacked capacitor memory cell capacitor, which has an increased capacitance.

It is yet a further object of the present invention to provide a novel fin-structured storage electrode of a stacked capacitor memory cell capacitor, which has an increased surface area.

It is a further more object of the present invention to provide a novel fin-structured storage electrode of a stacked capacitor memory cell capacitor, which has a high reliability.

It is still more object of the present invention to provide a novel fin-structured storage electrode of a stacked capacitor memory cell capacitor, which is capable of preventing fins from being bent or curved substantially.

It is moreover object of the present invention to provide a novel fin-structured storage electrode of a stacked capacitor memory cell capacitor, which is free from falling down.

It is an additional object of the present invention to provide a novel fin-structured storage electrode of a stacked capacitor memory cell capacitor, which is free from being broken.

It is a still additional object of the present invention to provide a novel fin-structured storage electrode of a stacked capacitor memory cell capacitor, which allows a scale down of the stacked capacitor memory cell capacitor.

It is yet an additional object of the present invention to provide a novel fin-structured storage electrode of a stacked capacitor memory cell capacitor, which allows increase in the density of integration of memory cell arrays.

It is a further additional object of the present invention to provide a novel fin-structured storage electrode of a stacked capacitor memory cell capacitor, which allows increase in the number of fins of the fin-structured storage electrode.

It is another object of the present invention to provide a novel method of fabricating a fin-structured storage electrode of a stacked capacitor memory cell capacitor, which is free from the problems as described above.

It is further another object of the present invention to provide a novel method of fabricating a fin-structured storage electrode of a stacked capacitor memory cell capacitor, which has a reduced occupied area.

It is still another object of the present invention to provide a novel method of fabricating a fin-structured storage electrode of a stacked capacitor memory cell capacitor, which has an increased capacitance.

It is yet another object of the present invention to provide a novel method of fabricating a fin-structured storage electrode of a stacked capacitor memory cell capacitor, which has an increased surface area.

It is more another object of the present invention to provide a novel method of fabricating a fin-structured storage electrode of a stacked capacitor memory cell capacitor, which has a high reliability.

It is still more another object of the present invention to provide a novel method of fabricating a fin-structured storage electrode of a stacked capacitor memory cell capacitor, which is capable of preventing fins from being bent or curved substantially.

It is moreover another object of the present invention to provide a novel method of fabricating a fin-structured storage electrode of a stacked capacitor memory cell capacitor, which is free from falling down.

It is additional another object of the present invention to provide a novel method of fabricating a fin-structured storage electrode of a stacked capacitor memory cell capacitor, which is free from being broken.

It is still additional another object of the present invention to provide a novel method of fabricating a fin-structured storage electrode of a stacked capacitor memory cell capacitor, which allows a scale down of the stacked capacitor memory cell capacitor.

It is yet additional another object of the present invention to provide a novel method of fabricating a fin-structured storage electrode of a stacked capacitor memory cell capacitor, which allows increase in the density of integration of memory cell arrays.

It is still further another object of the present invention to provide a novel method of fabricating a fin-structured storage electrode of a stacked capacitor memory cell capacitor, which allows increase in the number of fins of the fin-structured storage electrode.

The above and other objects, furatures and features of the present invention will be apparent from the following descriptions.

The present invention provides a capacitor comprising the following elements. An inter-layer insulator is formed over a silicon substrate. At least two interconnections are formed within the inter-layer insulator. The two interconnections are distanced at a pitch in a lateral direction. A fin-structured storage electrode comprises a vertically extending column portion and a plurality of fins, each of which laterally and radially extends from the vertically extending column portion. The fins are spaced in a vertical direction and the vertically extending column portion extends through the inter-layer insulator to a surface of the semiconductor substrate and also extends upwardly from a surface of the inter-layer insulator, wherein the vertically extending column portion is smaller in diameter within the inter-layer insulator and larger in diameter over the inter-layer insulator so that the vertically extending column portion within the inter-layer insulator is distanced by the inter-layer insulator from the two interconnections. A capacitive insulation film is formed on a surface of the fin-structured storage electrode. An opposite electrode is formed on the capacitive insulation film.

The present invention also provides a fin-structured storage electrode in a staked memory cell capacitor. The fin-structured storage electrode comprises a vertically extending column portion and a plurality of fins, each of which laterally and radially extends from the vertically extending column portion. The fins are spaced in a vertical direction. The vertically extending column portion extends through an inter-layer insulator formed over the silicon substrate to a surface of the semiconductor substrate. The vertically extending column portion extends upwardly from a surface of the inter-layer insulator, wherein the vertically extending column portion is smaller in diameter within the inter-layer insulator and larger in diameter over the inter-layer insulator so that the vertically extending column portion within the inter-layer insulator is distanced by the inter-layer insulator from at least two interconnections formed within the inter-layer insulator and distanced at a pitch in a lateral direction.

The present invention also provides a method of forming a fin-structured memory cell capacitor over a semiconductor substrate. The method comprises the following steps. An inter-layer insulator is formed over the silicon substrate. The inter-layer insulator includes at least two interconnections distanced at a pitch in a lateral direction. A formation is made for laminations of a plurality of pairs of first conductive films and spacer layers over the inter-layer insulator. A first contact hole is formed which vertically extends through the laminations of the conductive films and the spacer layers, The first contact hole has a first diameter. A second conductive film is formed, which extends both over the laminations of the first conductive films and the spacer layers and on side walls and a bottom of the first contact hole. The second conductive film is subjected to an etch back to leave the second conductive film only on the side walls of the first contact hole. The inter-layer insulator is selectively etched by use of the remaining second conductive films as a mask to form a second contact hole within the inter-layer insulator so that a part of the semiconductor substrate is shown through the second contact hole. The second contact hole has a diameter defined by a distance between the remaining second conductive films on the side walls of the first contact hole so that the second contact hole is smaller in diameter than the first contact hole by two times of a thickness of the second conductive film remaining on the side walls of the first contact hole. A third conductive film is formed, which extends not only within the second contact hole in the inter-layer insulator but also between the second conductive film remaining on the side walls as well as over the laminations of the conductive films and the spacer layers. A patterning is made to the third conductive film extending over the laminations of the first conductive films and the spacer layers and the laminations of the first conductive films and the spacer layers. The spacer layers are subjected to an anisotropic etching to remove the spacer layers and leave the first conductive films laterally and radially extending from the second conductive film remaining on the side walls so that the first conductive films are distanced in a vertical direction by a pitch defined by a thickness of the spacer layers thereby to form a fin-structured storage electrode. A formation of made for a capacitive insulation film not only on surfaces of the first conductive films but also on surfaces of the third conductive film extending over the laminations of the first conductive films and the spacer layers as well as surfaces of the second conductive films extending in the first contact hole. An opposite electrode is formed on the capacitive insulation film.

The present invention provides a method of forming a fin-structured storage electrode over a semiconductor substrate. The method comprises the following steps. An inter-layer insulator is formed over the silicon substrate. The inter-layer insulator includes at least two interconnections distanced at a pitch in a lateral direction. A formation is made for laminations of a plurality of pairs of first conductive films and spacer layers over the inter-layer insulator. A first contact hole is formed which vertically extends through the laminations of the conductive films and the spacer layers. The first contact hole has a first diameter. A formation is made for a second conductive film which extends both over the laminations of the first conductive films and the spacer layers and on side walls and a bottom of the first contact hole. The second conductive film is subjected to an etch back to leave the second conductive film only on the side walls of the first contact HOLE. A selective etching is made to the inter-layer insulator by use of the remaining second conductive films as a mask thereby to form a second contact hole within the inter-layer insulator so that a part of the semiconductor substrate is shown through the second contact hole. The second contact hole has a diameter defined by a distance between the remaining second conductive films on the side walls of the first contact hole so that the second contact hole is smaller in diameter than the first contact hole by two times of a thickness of the second conductive film remaining on the side walls of the first contact hole. A formation is made for a third conductive film which extends not only within the second contact hole in the inter-layer insulator but also between the second conductive film remaining on the side walls as well as over the laminations of the conductive films and the spacer layers. A patterning is made to the third conductive film extending over the laminations of the first conductive films and the spacer layers and the laminations of the first conductive films and the spacer layers. The spacer layers are subjected to an anisotropic etching to remove the spacer layers and leave the first conductive films laterally and radially extending from the second conductive film remaining on the side walls so that the first conductive films are distanced in a vertical direction by a pitch defined by a thickness of the spacer layers thereby to form a fin-structured storage electrode.

BRIEF DESCRIPTIONS OF THE DRAWINGS

Preferred embodiments of the present invention will be described in detail with reference to the accompanying drawings.

DISCLOSURE OF THE INVENTION

Figure 1A:
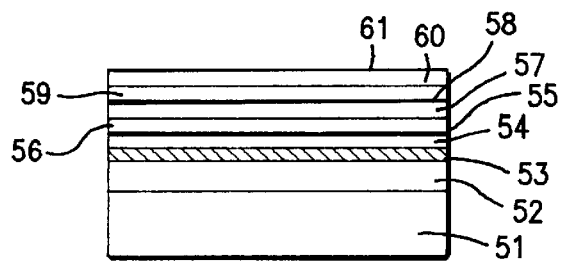
FIGS. 1A through 1E are fragmentary cross sectional elevation views illustrative of the conventional fin-structured storage electrode of the stacked memory cell capacitor in sequential steps involved in the conventional method of fabricating the same.
Figure 1B:
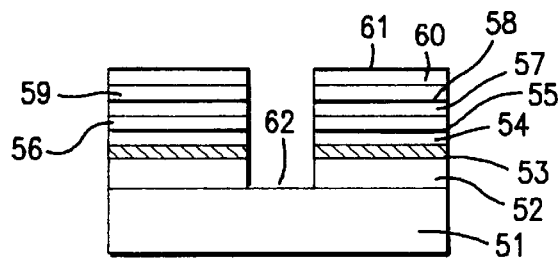
Figure 1C:
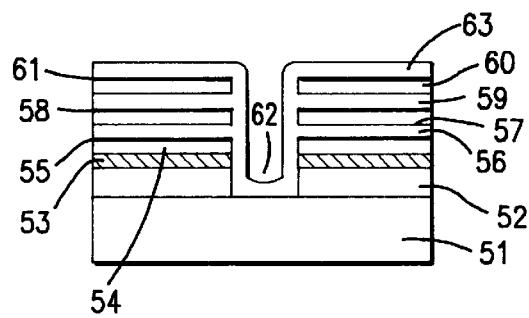
Figure 1D:
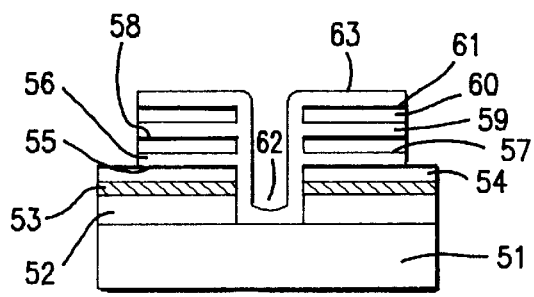
Figure 1E:
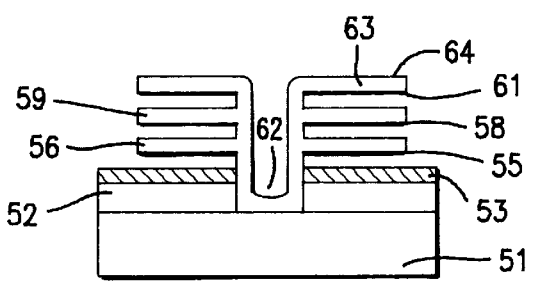

The present invention provides a capacitor comprising the following elements. An inter-layer insulator is formed over a silicon substrate. At least two interconnections are formed within the inter-layer insulator. The two interconnections are distanced at a pitch in a lateral direction. A fin-structured storage electrode comprises a vertically extending column portion and a plurality of fins, each of which laterally and radially extends from the vertically extending column portion. The fins are spaced in a vertical direction and the vertically extending column portion extends through the inter-layer insulator to a surface of the semiconductor substrate and also extends upwardly from a surface of the inter-layer insulator, wherein the vertically extending column portion is smaller in diameter within the inter-layer insulator and larger in diameter over the inter-layer insulator so that the vertically extending column portion within the inter-layer insulator is distanced by the inter-layer insulator from the two interconnections. A capacitive insulation film is formed on a surface of the fin-structured storage electrode. An opposite electrode is formed on the capacitive insulation film.

It is preferable that the vertically extending column portion over the inter-layer insulator has a first diameter and the vertically extending column portion within the inter-layer insulator has a second diameter which is smaller than the first diameter.

It is further preferable that the vertically extending column portion comprises a vertically extending center layer extending both through and over the inter-layer insulator and a side wall conductive film extending over the inter-layer insulator and surrounding the vertically extending center layer.

It is preferable to further form a silicon nitride film over the inter-layer insulator and wherein the vertically extending column portion comprises a vertically extending center layer extending both through and over the inter-layer insulator and a side wall conductive film extending both through and over the silicon nitride film and the side wall conductive film surrounding the vertically extending center layer.

It is preferable that the fins laterally and radially extend from the side wall conductive film.

The present invention also provides a fin-structured storage electrode in a staked memory cell capacitor. The fin-structured storage electrode comprises a vertically extending column portion and a plurality of fins, each of which laterally and radially extends from the vertically extending column portion. The fins are spaced in a vertical direction. The vertically extending column portion extends through an inter-layer insulator formed over the silicon substrate to a surface of the semiconductor substrate. The vertically extending column portion extends upwardly from a surface of the inter-layer insulator, wherein the vertically extending column portion is smaller in diameter within the inter-layer insulator and larger in diameter over the inter-layer insulator so that the vertically extending column portion within the inter-layer insulator is distanced by the inter-layer insulator from at least two interconnections formed within the inter-layer insulator and distanced at a pitch in a lateral direction.

It is preferable that the vertically extending column portion over the inter-layer insulator has a first diameter and the vertically extending column portion within the inter-layer insulator has a second diameter which is smaller than the first diameter.

It is further preferable that the vertically extending column portion comprises a vertically extending center layer extending both through and over the inter-layer insulator and a side wall conductive film extending over the inter-layer insulator and surrounding the vertically extending center layer.

It is preferable to further form a silicon nitride film over the inter-layer insulator and wherein the vertically extending column portion comprises a vertically extending center layer extending both through and over the inter-layer insulator and a side wall conductive film extending both through and over the silicon nitride film and the side wall conductive film surrounding the vertically extending center layer.

It is preferable that the fins laterally and radially extend from the side wall conductive film.

The present invention also provides a method of forming a fin-structured memory cell capacitor over a semiconductor substrate. The method comprises the following steps. An inter-layer insulator is formed over the silicon substrate. The inter-layer insulator includes at least two interconnections distanced at a pitch in a lateral direction. A formation is made for laminations of a plurality of pairs of first conductive films and spacer layers over the inter-layer insulator. A first contact hole is formed which vertically extends through the laminations of the conductive films and the spacer layers. The first contact hole has a first diameter. A second conductive film is formed, which extends both over the laminations of the first conductive films and the spacer layers and on side walls and a bottom of the first contact hole. The second conductive film is subjected to an etch back to leave the second conductive film only on the side walls of the first contact hole. The inter-layer insulator is selectively etched by use of the remaining second conductive films as a mask to form a second contact hole within the inter-layer insulator so that a part of the semiconductor substrate is shown through the second contact hole. The second contact hole has a diameter defined by a distance between the remaining second conductive films on the side walls of the first contact hole so that the second contact hole is smaller in diameter than the first contact hole by two times of a thickness of the second conductive film remaining on the side walls of the first contact hole. A third conductive film is formed, which extends not only within the second contact hole in the inter-layer insulator but also between the second conductive film remaining on the side walls as well as over the laminations of the conductive films and the spacer layers. A patterning is made to the third conductive film extending over the laminations of the first conductive films and the spacer layers and the laminations of the first conductive films and the spacer layers. The spacer layers are subjected to an anisotropic etching to remove the spacer layers and leave the first conductive films laterally and radially extending from the second conductive film remaining on the side walls so that the first conductive films are distanced in a vertical direction by a pitch defined by a thickness of the spacer layers thereby to form a fin-structured storage electrode. A formation of made for a capacitive insulation film not only on surfaces of the first conductive films but also on surfaces of the third conductive film extending over the laminations of the first conductive films and the spacer layers as well as surfaces of the second conductive films extending in the first contact hole. An opposite electrode is formed on the capacitive insulation film.

It is preferable that the inter-layer insulator is formed by a deposition of a silicon oxide film and the spacer layers are formed by a deposition of silicon oxide film containing at least any one of boron glass and phosphorus glass.

It is preferable to further form a silicon nitride film over the inter-layer insulator before the laminations of the first conductive films and the spacer layers are formed.

It is further preferable that the inter-layer insulator and the spacer layers are formed by depositions of silicon oxide films.

It is also preferable that the first, second and third conductive films are formed by depositions of polysilicon doped with an impurity.

The present invention provides a method of forming a fin-structured storage electrode over a semiconductor substrate. The method comprises the following steps. An inter-layer insulator is formed over the silicon substrate. The inter-layer insulator includes at least two interconnections distanced at a pitch in a lateral direction. A formation is made for laminations of a plurality of pairs of first conductive films and spacer layers over the inter-layer insulator. A first contact hole is formed which vertically extends through the laminations of the conductive films and the spacer layers. The first contact hole has a first diameter. A formation is made for a second conductive film which extends both over the laminations of the first conductive films and the spacer layers and on side walls and a bottom of the first contact hole. The second conductive film is subjected to an etch back to leave the second conductive film only on the side walls of the first contact hole. A selective etching is made to the inter-layer insulator by use of the remaining second conductive films as a mask thereby to form a second contact hole within the inter-layer insulator so that a part of the semiconductor substrate is shown through the second contact hole. The second contact hole has a diameter defined by a distance between the remaining second conductive films on the side walls of the first contact hole so that the second contact hole is smaller in diameter than the first contact hole by two times of a thickness of the second conductive film remaining on the side walls of the first contact hole. A formation is made for a third conductive film which extends not only within the second contact hole in the inter-layer insulator but also between the second conductive film remaining on the side walls as well as over the laminations of the conductive films and the spacer layers. A patterning is made to the third conductive film extending over the laminations of the first conductive films and the spacer layers and the laminations of the first conductive films and the spacer layers. The spacer layers are subjected to an anisotropic etching to remove the spacer layers and leave the first conductive films laterally and radially extending from the second conductive film remaining on the side walls so that the first conductive films are distanced in a vertical direction by a pitch defined by a thickness of the spacer layers thereby to form a fin-structured storage electrode.

It is preferable that the inter-layer insulator is formed by a deposition of a silicon oxide film and the spacer layers are formed by a deposition of silicon oxide film containing at least any one of boron glass and phosphorus glass.

It is preferable to further form a silicon nitride film over the inter-layer insulator before the laminations of the first conductive films and the spacer layers are formed.

It is also preferable that the inter-layer insulator and the spacer layers are formed by depositions of silicon oxide films.

It is preferable that the first, second and third conductive films are formed by depositions of polysilicon doped with an impurity.

PREFERRED EMBODIMENTS

Figure 2:
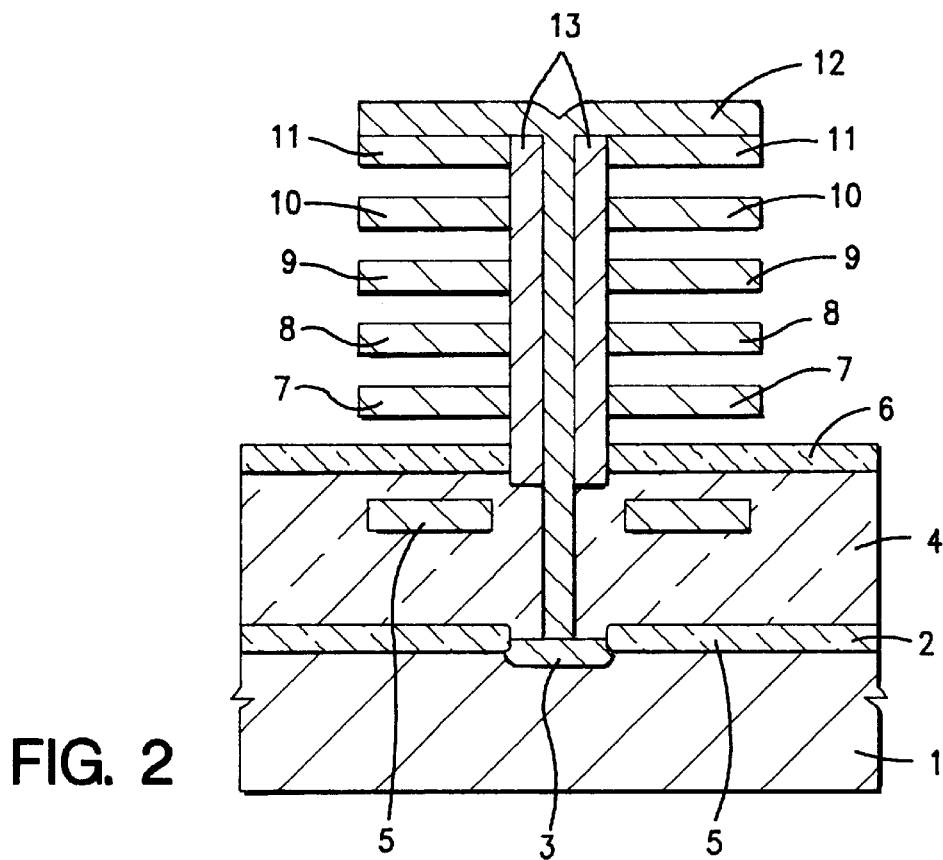
FIG. 2 is a fragmentary cross sectional elevation view illustrative of a novel fin-structured storage electrode of the stacked memory cell capacitor in a first embodiment according to the present invention.

A first embodiment according to the present invention will be described with reference to FIG. 2 illustrative of a novel fin-structured storage electrode of the stacked memory cell capacitor, as well as FIGS. 3A through 3G illustrative of a novel fin-structured storage electrode of the stacked memory cell capacitor in sequential steps involved in a novel method of fabricating the same.

With reference to FIG. 2, field oxide films 2 are selectively formed over a p-type silicon substrate 1. An n-type diffusion layer 3 is selectively formed over the p-type silicon substrate 1. The n-type diffusion layer 3 extends between the field oxide films 2. An inter-layer insulator 4 is formed over the field oxide film 2 and the n-type diffusion layer 3. Within the inter-layer insulator 4, low level interconnections 5, for example, word lines or bit liens are formed. The low level interconnections 5 are distanced at a narrowest pitch but which is slightly larger than a lateral size of the n-type diffusion layer 3 or a distance between the field oxide film 2. The low level interconnections 5 are separated by the inter-layer insulator 4 from the field oxide film 2. A silicon nitride film 6 is formed, which extends aver the top surface of the inter-layer insulator 4. The silicon nitride film 6 will serve as a mask to etchant or a hydrofluoric acid solution so as to protect the inter-layer insulator 4 from a wet etching. A storage electrode contact hole is formed to vertically extend through the silicon nitride film 6, the inter-layer insulator 4 to the top surface of the n-type diffusion layer 3. The contact hole is positioned over the n-type diffusion layer 3. The contact hole has a diameter which is sufficiently smaller than the lateral size of the n-type diffusion layer 3. The contact hole vertically extends between the low level interconnections 5, wherein the contact hole is separated by the inter-layer insulator 4 from each of the low level interconnections 5. A column conductive layer 12 is provided, which comprises a vertically extending portion extending vertically within the contact hole and projecting upwardly from the silicon nitride film 6 and a laterally extending portion laterally extending from the top of the vertically extending portion toward radial directions. The column conductive layer 12 has a thickness defined by the diameter of the contact hole. In order to support the vertically extending portion of the column conductive layer 12, a side wall conductive layer 13 is provided which surrounds the vertically extending portion of the column conductive layer 12. The side wall conductive layer 13 also extends from the upper portion of the inter-layer insulator 4 along the vertically extending portion of the column conductive layer 12 to the bottom of the laterally extending portion of the column conductive layer 12. The bottom of the side wall conductive layer 13 has a higher level than the low level interconnections 5. The diameter of the side wall conductive layer 13 surrounding the vertically extending portion of the column conductive layer 12 may have a larger diameter than the lateral size of the diffusion layer 3. The diameter of the side wall conductive layer 13 surrounding the vertically extending portion of the column conductive layer 12 may be slightly smaller than the pitch of the low level interconnections 5. A first conductive layer 7 is provided which laterally extends from the side wall conductive layer 13 toward radial directions. The first conductive layer 7 has a higher level than the silicon nitride film 6. The first conductive layer 7 is spaced above from the silicon nitride film 6. The first conductive layer 7 has the same lateral size as the laterally extending portion of the column conductive layer 12. A second conductive layer 8 is provided which laterally extends from the side wall conductive layer 13 toward radial directions. The second conductive layer 8 has a higher level than the first conductive layer 7. The second conductive layer 8 is spaced above from the first conductive layer 7. The second conductive layer 8 has the same lateral size as the laterally extending portion of the column conductive layer 12. A third conductive layer 9 is provided which laterally extends from the side wall conductive layer 13 toward radial directions. The third conductive layer 9 has a higher level than the second conductive layer 8. The third conductive layer 9 is spaced above from the second conductive layer 8. The third conductive layer 9 has the same lateral size as the laterally extending portion of the column conductive layer 12. A fourth conductive layer 10 is provided which laterally extends from the side wall conductive layer 13 toward radial directions. The fourth conductive layer 10 has a higher level than the third conductive layer 9. The fourth conductive layer 10 is spaced above from the third conductive layer 9. The fourth conductive layer 10 has the same lateral size as the laterally extending portion of the column conductive layer 12. A fifth conductive layer 11 is provided which laterally extends from the side wall conductive layer 13 toward radial directions. The fifth conductive layer 11 extends in contact with the bottom surface of the laterally extending portion of the column conductive layer 12. The fifth conductive layer 11 has a higher level than the fourth conductive layer 10. The fifth conductive layer 11 is spaced above from the fourth conductive layer 10. The fifth conductive layer 11 has the same lateral size as the laterally extending portion of the column conductive layer 12. The above first, second, third, fourth and fifth conductive layers 7, 8, 9, 10 and 11 are aligned at a constant pitch. The above first, second, third, fourth and fifth conductive layers 7, 8, 9, 10 and 11 serve as first, second, third, fourth and fifth fins of the fin-structured storage electrode of the stacked memory cell capacitor.

In accordance with the present invention, the side wall conductive layer 13 is provided to support the vertically extending contact plug portion of the column conductive film. This structural feature allows reduction in diameter of the vertically extending contact plug portion. This allows reduction in a pitch between the low level interconnections 5 or bit liens. This allows an increase in density of the integration of the memory cell array. The side wall conductive layer 13 supporting the contact plug portion of the column conductive film 12 is capable of preventing the fin-structured storage electrode from falling down or peeling off.

Although the number of the fins of the above fin-structured storage electrode is five in the above embodiment, it is possible to increase the number of fins of the above fin-structured storage electrode.

The above fin-structured storage electrode of the stacked memory cell capacitor is applicable to 0.2 micrometers scale rule, for example, 1 Gbit dynamic random access memory device. In this case, the diameter of the capacitive contact hole 22 has to be set at 0.1 micrometer. The side wall conductive film 13 supports the contact plug portion of the column conductive film 12 in order to prevent the fin-structured storage electrode from falling down or peeling off.

The above fin-structured storage electrode of the stacked memory cell capacitor may be fabricated as follows.

Figure 3A:
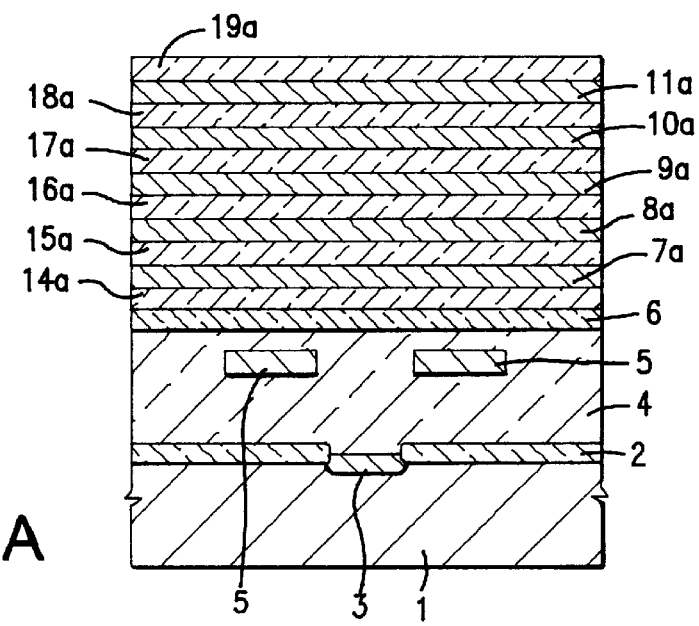
FIGS. 3A through 3G are fragmentary cross sectional elevation views illustrative of a novel fin-structured storage electrode of the stacked memory cell capacitor in sequential steps involved in a novel method of fabricating the same in a first embodiment according to the present invention.

With reference to FIG. 3A, field oxide films 2 are selectively formed over a p-type silicon substrate 1 by a local oxidation of silicon method. An n-type diffusion layer 3 is formed over the silicon substrate 1 by self-alignment technique wherein the n-type diffusion layer 3 extends between the field oxide films 2. An inter-layer insulator 4 is formed which covers the field oxide films 2 and the n-type diffusion layer 3. The inter-layer insulator 4 is deposited by a chemical vapor deposition method and planarized by a chemical and mechanical polishing. The inter-layer insulator 4 may comprise either a single insulation film or laminations of multiple insulation films. Within the inter-layer insulator 4, low level interconnections 5 or bit lines are formed. A silicon nitride film 6 is deposited over the inter-layer insulator 4 by a chemical vapor deposition method. The silicon nitride film 6 has a thickness in the range of 50–100 nanometers. A first spacer layer 14*a* is formed over the silicon nitride film 6. The first spacer layer 14*a* may comprise a silicon oxide film deposited by a chemical vapor deposition method and having a thickness of 50 nanometers. A first conductive layer 7*a* is formed over the first spacer layer 14*a*. The first conductive layer 7*a* may comprise a polysilicon film deposited by a chemical vapor deposition method and having a thickness of 50 nanometers. The polysilicon film is doped with phosphorus at an impurity concentration of $1\times10^{20}$ atoms/cm$^3$. A second spacer layer 15a is formed over the first conductive layer 7a. The second spacer layer 15a may comprise a silicon oxide film deposited by a chemical vapor deposition method and having a thickness of 50 nanometers. A second conductive layer 8a is formed over the second spacer layer 15a. The second conductive layer 8a may comprise a polysilicon film deposited by a chemical vapor deposition method and having a thickness of 50 nanometers. The polysilicon film is doped with phosphorus at an impurity concentration of $1\times10^{20}$ atoms/cm$^3$. A third spacer layer 16a is formed over the second conductive layer 8a. The third spacer layer 16a may comprise a silicon oxide film deposited by a chemical vapor deposition method and having a thickness of 50 nanometers. A third conductive layer 9a is formed over the third spacer layer 16a. The third conductive layer 9a may comprise a polysilicon film deposited by a chemical vapor deposition method and having a thickness of 50 nanometers. The polysilicon film is doped with phosphorus at an impurity concentration of $1\times10^{20}$ atoms/cm$^3$. A fourth spacer layer 17a is formed over the third conductive layer 9a. The fourth spacer layer 17a may comprise a silicon oxide film deposited by a chemical vapor deposition method and having a thickness of 50 nanometers. A fourth conductive layer 10a is formed over the fourth spacer layer 17a. The fourth conductive layer 10a may comprise a polysilicon film deposited by a chemical vapor deposition method and having a thickness of 50 nanometers. The polysilicon film is doped with phosphorus at an impurity concentration of $1\times10^{20}$ atoms/cm$^3$. A fifth spacer layer 18a is formed over the fourth conductive layer 10a. The fifth spacer layer 18a may comprise a silicon oxide film deposited by a chemical vapor deposition method and having a thickness of 50 nanometers. A fifth conductive layer 11a is formed over the fifth spacer layer 18a. The fifth conductive layer 11a may comprise a polysilicon film deposited by a chemical vapor deposition method and having a thickness of 50 nanometers. The polysilicon film is doped with phosphorus at an impurity concentration of $1\times10^{20}$ atoms/cm$^3$. A sixth spacer layer 19a is formed over the fifth conductive layer 11a. The sixth spacer layer 19a may comprise a silicon oxide film deposited by a chemical vapor deposition method and having a thickness of 50 nanometers.

Figure 3B:
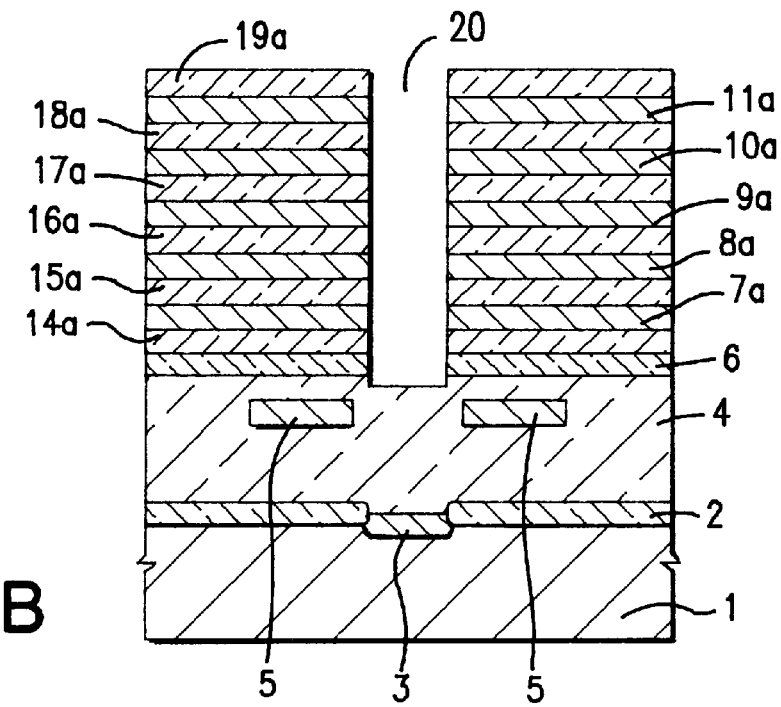

With reference to FIG. 3B, the laminations of the first, second, third, fourth, fifth and sixth spacer layers 14a, 15a, 16a, 17a, 18a and 19a as well as the first, second, third, fourth and fifth conductive layers 7a, 8a, 9a, 10a and 11a are subjected to an anisotropic etching or a dry etching by use of photo-lithography technique to form a storage electrode contact hole 20 which vertically extends from the sixth spacer layer 19a to the upper portion of the inter-layer insulator 4. The bottom of the storage electrode contact hole 20 has a higher level than the low level interconnections 5. The storage electrode contact hole 20 has a diameter of 0.2 micrometers.

Figure 3C:
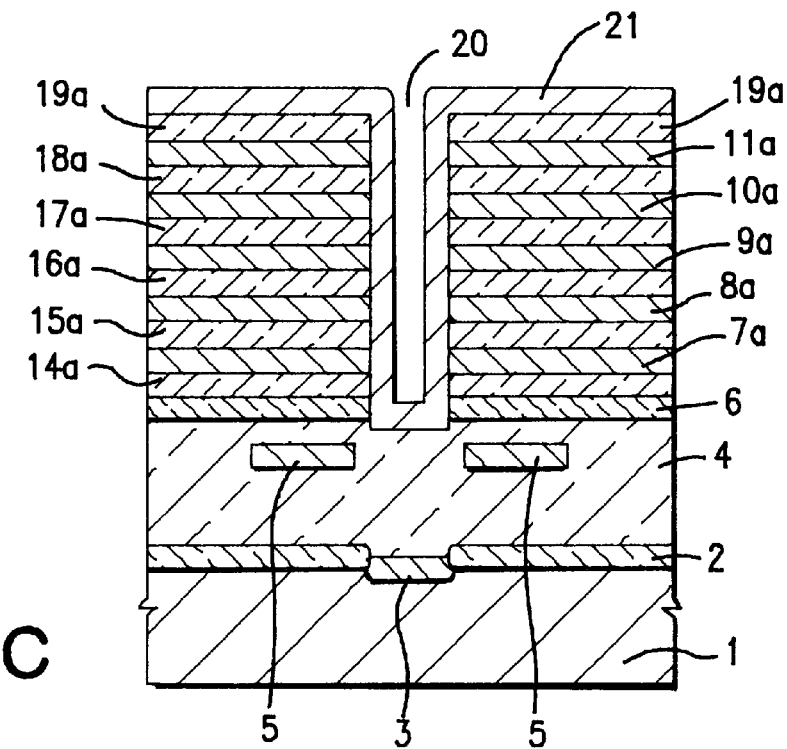

With reference to FIG. 3C, a conductive film 21 having a thickness of 50 nanometers is entirely formed which extends over the sixth spacer layer 19a and within the storage electrode contact hole 20. The conductive film 21 is doped with phosphorus.

Figure 3D:
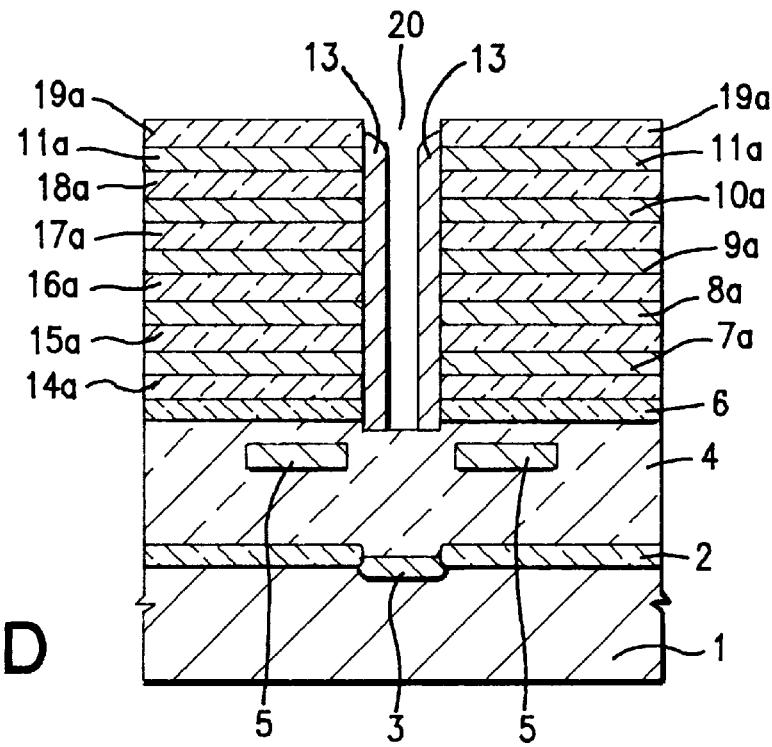

With reference to FIG. 3D, the conductive film 21 is then subjected to an etch back by an anisotropic etching or a reactive ion etching so that the conductive film 21 remains only within the storage electrode contact hole 20 thereby to form side wall conductive films 13 on vertical side walls of the storage electrode contact hole 20. The sixth spacer layer 19a will serve as an etching stopper to the reactive ion etching so as to protect the fifth conductive layer 11a from the reactive ion etching.

Figure 3E:
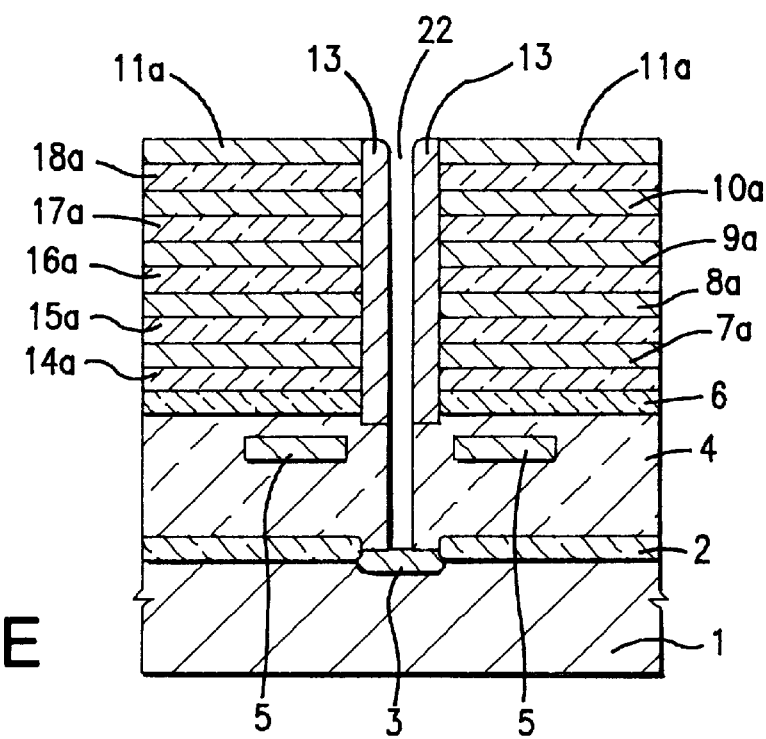
Figure 3F:
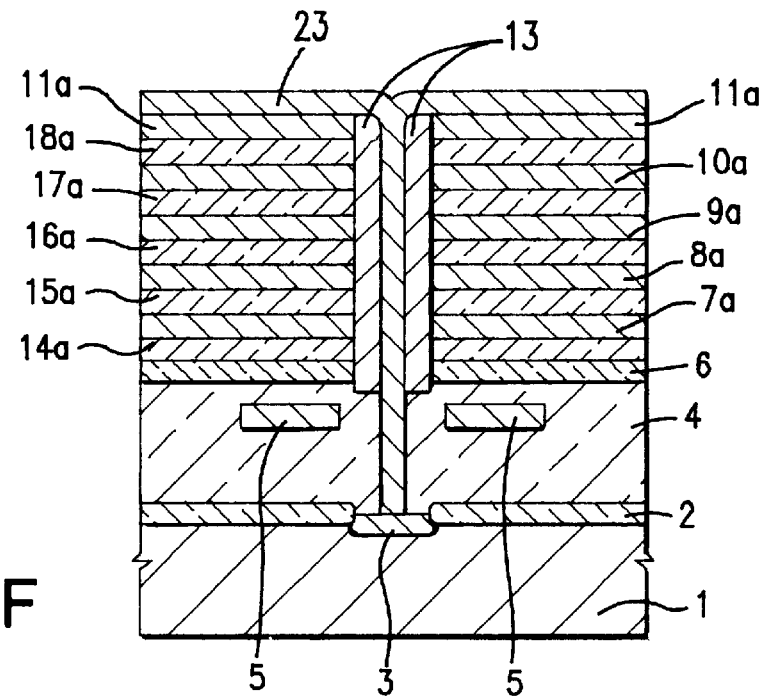

With reference to FIG. 3E, a reactive ion etching is carried out in a reactive gas which etches silicon oxide to selectively etch the inter-layer insulator 4 of silicon oxide so that a capacitive contact hole 22 is formed, which vertically extends to a surface of the n-type diffusion layer 3. As a result, a part of the surface of the n-type diffusion layer 3 is shown through the capacitive contact hole 22. By this reactive ion etching, the sixth spacer layer 19a made of silicon oxide is also removed. Notwithstanding, the fifth conductive layer 11a made of polysilicon and the side wall conductive films 13 made of polysilicon are not etched by the reactive ion etching by use of the reactive gas which is capable of etching silicon oxide. A diameter of the capacitive contact hole 22 is defined by a distance between the side wall conductive films 13 within the storage electrode contact hole 20. The diameter of the capacitive contact hole 22 is smaller than a lateral size of the n-type diffusion layer 3. The diameter of the capacitive contact hole 22 is also smaller than a distance between the low level interconnections 5. The capacitive contact hole 22 is separated by the inter-layer insulator 4 from the low level interconnections 5.

With reference to FIG. 3E, a conductive film 23 is entirely deposited over the fifth conductive layer 11a and within the storage electrode contact hole 20 so that the conductive film 23 is made into contact with the n-type diffusion layer 3. The conductive film 23 has a thickness of 100 nanometers. The conductive film 23 may comprise a polysilicon film doped with phosphorus and deposited by a chemical vapor deposition method. The conductive film 23 comprises a vertically extending contact plug extending within the storage electrode contact hole 20 and a laterally extending portion laterally extending from the top of the vertically extending contact plug toward the lateral radial directions.

Figure 3G:
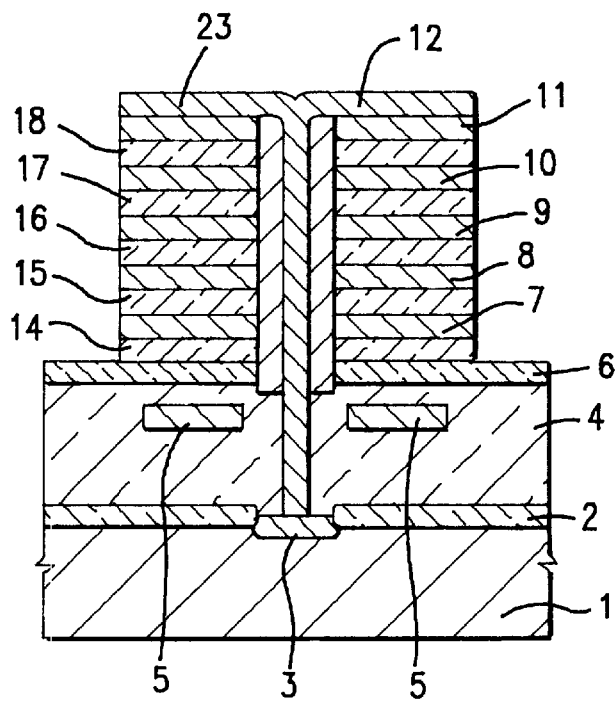

With reference to FIG. 3G, by use of a photo-lithography and a dry etching process, a dry etching is carried out to selectively etch the laterally extending portion of the conductive film 23, the fifth conductive layer 11a, the fifth spacer layer 18a, the fourth conductive layer 10a, the fourth spacer layer 17a, the third conductive layer 9a, the third spacer layer 16a, the second conductive layer 8a, the second spacer layer 15a, the first conductive layer 7a and the first spacer layer 14a. However, the silicon nitride film 6 is not etched. The silicon nitride film 6 serves as an etching stopper. As a result, laminations of the first spacer layer 14, the first conductive layer 7, the second spacer layer 15, the second conductive layer 8, the third spacer layer 16, the third conductive layer 9, the fourth spacer layer 17, the fourth conductive layer 10, the fifth spacer layer 18, the fifth conductive layer 11 and a laterally extending portion of a column conductive layer 12. Therefore, the conductive layer 12 comprises a vertically extending contact plug portion within the storage electrode contact hole 20 and a laterally extending portion laterally extending from the top of the vertically extending contact plug portion toward lateral radial directions.

With reference back to FIG. 2, the first spacer layer 14, the second spacer layer 15, the third spacer layer 16, the fourth spacer layer 17, the fifth spacer layer 18 and the sixth spacer layer 19 are removed by a wet etching process which uses a hydrofluoric acid solution thereby to form the fin-structured storage electrode.

Figure 4:
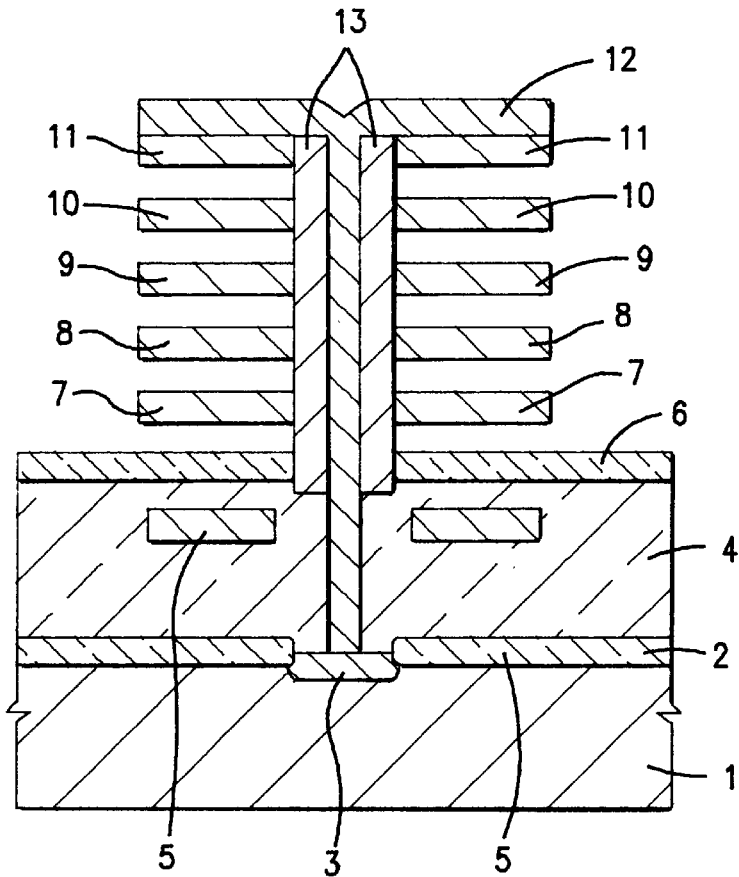
FIG. 4 is a fragmentary cross sectional elevation view illustrative of a novel fin-structured storage electrode of the stacked memory cell capacitor in a second embodiment according to the present invention.

A second embodiment according to the present invention will be described with reference to FIG. 4 illustrative of a novel fin-structured storage electrode of the stacked memory cell capacitor. The novel fin-structured storage electrode of the stacked memory cell capacitor in a second embodiment differs from that of the first embodiment in providing no silicon nitride film over the inter-layer insulator.

With reference to FIG. 4, field oxide films 2 are selectively formed over a p-type silicon substrate 1. An n-type diffusion layer 3 is selectively formed over the p-type silicon substrate 1. The n-type diffusion layer 3 extends between the field oxide films 2. An inter-layer insulator 4 is formed over the field oxide film 2 and the n-type diffusion layer 3. Within the inter-layer insulator 4, low level interconnections 5, for example, word lines or bit liens are formed. The low level interconnections 5 are distanced at a narrowest pitch but which is slightly larger than a lateral size of the n-type diffusion layer 3 or a distance between the field oxide film 2. The low level interconnections 5 are separated by the inter-layer insulator 4 from the field oxide film 2. A storage electrode contact hole is formed to vertically extend through the inter-layer insulator 4 to the top surface of the n-type diffusion layer 3. The contact hole is positioned over the n-type diffusion layer 3. The contact hole has a diameter which is sufficiently smaller than the lateral size of the n-type diffusion layer 3. The contact hole vertically extends between the low level interconnections 5, wherein the contact hole is separated by the inter-layer insulator 4 from each of the low level interconnections 5. A column conductive layer 12 is provided, which comprises a vertically extending portion extending vertically within the contact hole and projecting upwardly from the inter-layer insulator 4 and a laterally extending portion laterally extending from the top of the vertically extending portion toward radial directions. The column conductive layer 12 has a thickness defined by the diameter of the contact hole. In order to support the vertically extending portion of the column conductive layer 12, a side wall conductive layer 13 is provided which surrounds the vertically extending portion of the column conductive layer 12. The side wall conductive layer 13 also extends from the upper portion of the inter-layer insulator 4 along the vertically extending portion of the column conductive layer 12 to the bottom of the laterally extending portion of the column conductive layer 12. The bottom of the side wall conductive layer 13 has a higher level than the low level interconnections 5. The diameter of the side wall conductive layer 13 surrounding the vertically extending portion of the column conductive layer 12 may have a larger diameter than the lateral size of the diffusion layer 3. The diameter of the side wall conductive layer 13 surrounding the vertically extending portion of the column conductive layer 12 may be slightly smaller than the pitch of the low level interconnections 5. A first conductive layer 7 is provided which laterally extends from the side wall conductive layer 13 toward radial directions. The first conductive layer 7 has a higher level than the inter-layer insulator 4. The first conductive layer 7 is spaced above from the inter-layer insulator 4. The first conductive layer 7 has the same lateral size as the laterally extending portion of the column conductive layer 12. A second conductive layer 8 is provided which laterally extends from the side wall conductive layer 13 toward radial directions. The second conductive layer 8 has a higher level than the first conductive layer 7. The second conductive layer 8 is spaced above from the first conductive layer 7. The second conductive layer 8 has the same lateral size as the laterally extending portion of the column conductive layer 12. A third conductive layer 9 is provided which laterally extends from the side wall conductive layer 13 toward radial directions. The third conductive layer 9 has a higher level than the second conductive layer 8. The third conductive layer 9 is spaced above from the second conductive layer 8. The third conductive layer 9 has the same lateral size as the laterally extending portion of the column conductive layer 12. A fourth conductive layer 10 is provided which laterally extends from the side wall conductive layer 13 toward radial directions. The fourth conductive layer 10 has a higher level than the third conductive layer 9. The fourth conductive layer 10 is spaced above from the third conductive layer 9. The fourth conductive layer 10 has the same lateral size as the laterally extending portion of the column conductive layer 12. A fifth conductive layer 11 is provided which laterally extends from the side wall conductive layer 13 toward radial directions. The fifth conductive layer 11 extends in contact with the bottom surface of the laterally extending portion of the column conductive layer 12. The fifth conductive layer 11 has a higher level than the fourth conductive layer 10. The fifth conductive layer 11 is spaced above from the fourth conductive layer 10. The fifth conductive layer 11 has the same lateral size as the laterally extending portion of the column conductive layer 12. The above first, second, third, fourth and fifth conductive layers 7, 8, 9, 10 and 11 are aligned at a constant pitch. The above first, second, third, fourth and fifth conductive layers 7, 8, 9, 10 and 11 serve as first, second, third, fourth and fifth fins of the fin-structured storage electrode of the stacked memory cell capacitor.

In accordance with the present invention, the side wall conductive layer 13 is provided to support the vertically extending contact plug portion of the column conductive film. This structural feature allows reduction in diameter of the vertically extending contact plug portion. This allows reduction in a pitch between the low level interconnections 5 or bit liens. This allows an increase in density of the integration of the memory cell array. The side wall conductive layer 13 supporting the contact plug portion of the column conductive film 12 is capable of preventing the fin-structured storage electrode from falling down or peeling off.

Although the number of the fins of the above fin-structured storage electrode is five in the above embodiment, it is possible to increase the number of fins of the above fin-structured storage electrode.

The above fin-structured storage electrode of the stacked memory cell capacitor is applicable to 0.2 micrometers scale rule, for example, 1 Gbit dynamic random access memory device. In this case, the diameter of the capacitive contact hole 22 has to be set at 0.1 micrometer. The side wall conductive film 13 supports the contact plug portion of the column conductive film 12 in order to prevent the fin-structured storage electrode from falling down or peeling off.

The above spacer layers comprise boro-phospho silicate glass films. The inter-layer insulator 4 comprises a silicon oxide film deposited by a chemical vapor deposition. The spacer layers made of boro-phospho silicate glass may selectively be removed as follows.

In an etching chamber, a vapor phase hydrofluoric gas of 600 Pa and a steam of not more than 1 Pa are introduced as a reaction gas into an etching chamber so that, at a room temperature, the spacer layers are etched for a predetermined time. Under those etching conditions, an etching rate of the spacer layer is 1000 nanometers/min. An etching rate of the inter-layer insulator 6 is 1.5 nanometers/min. The etching time is set at 15 seconds. In this case, an etching amount of the inter-layer insulator made of silicon oxide is not more than 0.2 nanometers.

Figure 5:
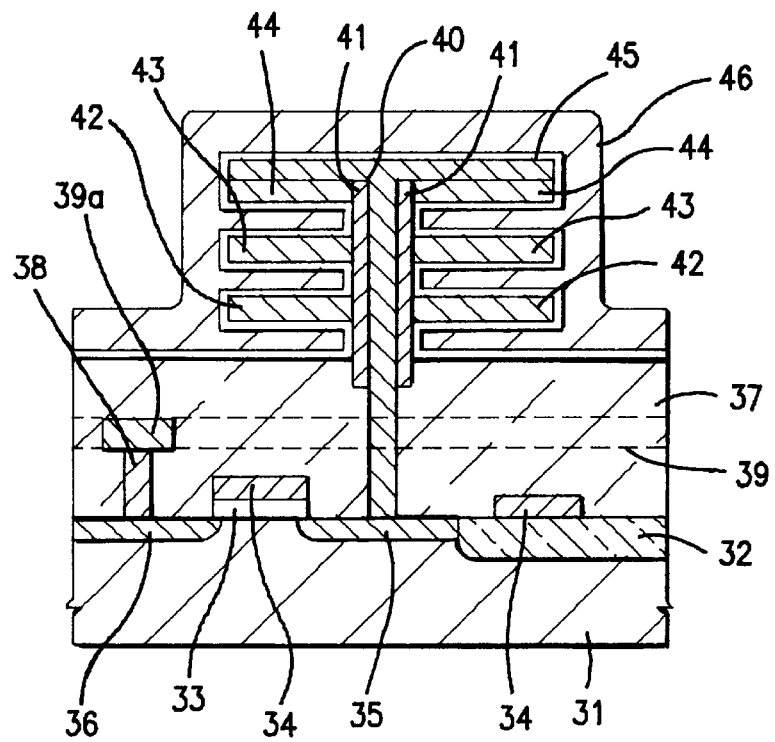
FIG. 5 is a fragmentary cross sectional elevation view illustrative of a novel fin-structured storage electrode of the stacked memory cell capacitor in a third embodiment according to the present invention.

A second embodiment according to the present invention will be described with reference to FIG. 5 illustrative of a novel fin-structured storage electrode of the stacked memory cell capacitor.

With reference to FIG. 5, field oxide films 32 are selectively formed over a p-type silicon substrate 31. A gate insulation film 33 is selectively formed over the p-type silicon substrate 31. A gate electrode 34 or word lines are formed over the gate insulation film. A capacitive diffusion layer 35 is selectively formed in an upper region of the silicon substrate 31. A bit line diffusion layer 36 is also selectively formed in an upper region of the silicon substrate 31. As a result, an n-channel MOS field effect transistor is formed in the silicon substrate 1. The n-channel MOS field effect transistor serves as a transfer transistor. Another gate electrode is formed over the filed oxide film 32. The gate electrodes or ward lines are connected to the gate electrode of the transfer transistor. An inter-layer insulator 37 is formed over the silicon substrate 31 to bury the transfer transistor. A bit line contact hole is formed over the bit line diffusion layer 36. Within the bit line contact hole, a bit line contact plug 38 made of titanium, titanium nitride or tungsten is filled. A bit line 39 made of a conductive material such as tungsten. The bit line 39 is connected through a bit line pad 39a to the bit line contact plug 38. The bit line 39 is formed within the inter-layer insulator 37.

A storage electrode contact hole is formed to vertically extend through the inter-layer insulator 37 to the top surface of the n-type capacitive diffusion layer 35. The storage electrode contact hole is positioned over the n-type capacitive diffusion layer 35. The storage electrode contact hole has a diameter which is sufficiently smaller than the lateral size of the n-type diffusion layer 35. The contact hole vertically extends through an intermediate position between the gate electrodes 34, wherein the contact hole is separated by the inter-layer insulator 37 from each of the gate electrodes 34. A column conductive layer 40 is provided, which comprises a vertically extending portion extending vertically within the contact hole and projecting upwardly from the inter-layer insulator 37 and a laterally extending portion laterally extending from the top of the vertically extending portion toward radial directions. The column conductive layer 40 has a thickness defined by the diameter of the contact hole. In order to support the vertically extending portion of the column conductive layer 40, a side wall conductive layer 41 is provided which surrounds the vertically extending portion of the column conductive layer 40. The side wall conductive layer 41 also extends from the upper portion of the inter-layer insulator 37 along the vertically extending portion of the column conductive layer 40 to the bottom of the laterally extending portion of the column conductive layer 40. The bottom of the side wall conductive layer 41 has a higher level than the gate electrodes 34. The diameter of the side wall conductive layer 40 surrounding the vertically extending portion of the column conductive layer 41 may have a larger diameter than the lateral size of the diffusion layer 35. The diameter of the side wall conductive layer 41 surrounding the vertically extending portion of the column conductive layer 40 may be smaller than the pitch of the gate electrodes 34. A first conductive layer 42 is provided which laterally extends from the side wall conductive layer 41 toward radial directions. The first conductive layer 42 has a higher level than the inter-layer insulator 37. The first conductive layer 42 is spaced above from the inter-layer insulator 37. The first conductive layer 42 has the same lateral size as the laterally extending portion of the column conductive layer 40. A second conductive layer 43 is provided which laterally extends from the side wall conductive layer 41 toward radial directions. The second conductive layer 43 has a higher level than the first conductive layer 42. The second conductive layer 43 is spaced above from the first conductive layer 42. The second conductive layer 43 has the same lateral size as the laterally extending portion of the column conductive layer 40. A third conductive layer 44 is provided which laterally extends from the side wall conductive layer 41 toward radial directions. The third conductive layer 44 has a higher level than the second conductive layer 43. The third conductive layer 44 is spaced above from the second conductive layer 43. The third conductive layer 44 has the same lateral size as the laterally extending portion of the column conductive layer 40. A capacitive insulation film 45 is formed in contact with the surface of the fin-structured storage electrode. A plate electrode 46 serving as an opposite electrode is formed on the capacitive insulation film 45.

In accordance with the present invention, the side wall conductive layer 41 is provided to support the vertically extending contact plug portion of the column conductive film 40. This structural feature allows reduction in diameter of the vertically extending contact plug portion. This allows reduction in a pitch between the gate electrodes 34 or bit liens. This allows an increase in density of the integration of the memory cell array. The side wall conductive layer 41 supporting the contact plug portion of the column conductive film 40 is capable of preventing the fin-structured storage electrode from falling down or peeling off.

Although the number of the fins of the above fin-structured storage electrode is three in the above embodiment, it is possible to increase the number of fins of the above fin-structured storage electrode.

The above fin-structured storage electrode of the stacked memory cell capacitor is applicable to 0.2 micrometers scale rule, for example, 1 Gbit dynamic random access memory device. In this case, the occupied area of the fin-structured memory cell capacitor is 0–4 micrometers×0.4 micrometers. The height of the fin-structured storage electrode is 0.4 micrometers. This scaled down fin-structured memory cell capacitor is applicable to the 1 Gbit dynamic random access memory. The side wall conductive film 13 supports the contact plug portion of the column conductive film 12 in order to prevent the fin-structured storage electrode from falling down or peeling off.

In the foregoing embodiments, the conductive material is polysilicon doped with an impurity. Notwithstanding, it is possible to use a refractory metal silicide film.

As to the plate electrode, a barrier metal film may be interposed between the plate electrode and the capacitive insulation film.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A capacitor comprising:

a semiconductor substrate;

an inter-layer insulator formed over said semiconductor substrate;

at least two interconnections formed within said inter-layer insulator, said two interconnections being distanced at a pitch in a lateral direction;

a fin-structured storage electrode comprising a vertically extending column portion and a plurality of fins, each of which laterally and radially extends from said vertically extending column portion, said fins being spaced in a vertical direction and said vertically extending column portion extending through said inter-layer insulator to a surface of said semiconductor substrate and also extending upwardly from a surface of said inter-layer insulator, wherein said vertically extending column portion is smaller in diameter within said inter-layer insulator and larger in diameter over said inter-layer insulator so that said vertically extending column portion within said inter-layer insulator is distanced by said inter-layer insulator from said two interconnections;

a capacitive insulation film formed on a surface of said fin-structured storage electrode; and an opposite electrode formed on said capacitive insulation film.

2. The capacitor as claimed in claim 1, wherein said vertically extending column portion comprises a vertically extending center layer extending both through and over said inter-layer insulator and a side wall conductive film extending over said inter-layer insulator and surrounding said vertically extending center layer.

3. The capacitor as claimed in claim 2, wherein said fins laterally and radially extend from said side wall conductive film.

4. The capacitor as claimed in claim 1, further comprising a silicon nitride film over said inter-layer insulator and wherein said vertically extending column portion comprises a vertically extending center layer extending both through and over said inter-layer insulator and a side wall conductive film extending both through and over said silicon nitride film and said side wall conductive film surrounding said vertically extending center layer.

5. A fin-structured storage electrode in a staked memory cell capacitor, said fin-structured storage electrode comprising a vertically extending column portion and a plurality of fins, each of which laterally and radially extends from said vertically extending column portion, said fins being spaced in a vertical direction, said vertically extending column portion extending through an inter-layer insulator formed over a surface of a semiconductor substrate, said vertically extending column portion extending upwardly from a surface of said inter-layer insulator, wherein said vertically extending column portion is smaller in diameter within said inter-layer insulator and larger in diameter over said inter-layer insulator so that said vertically extending column portion within said inter-layer insulator is distanced by said inter-layer insulator from at least two interconnections formed within said inter-layer insulator and distanced at a pitch in a lateral direction.

6. The capacitor as claimed in claim 5, wherein said vertically extending column portion comprises a vertically extending center layer extending both through and over said inter-layer insulator and a side wall conductive film extending over said inter-layer insulator and surrounding said vertically extending center layer.

7. The capacitor as claimed in claim 6, wherein said fins laterally and radially extend from said side wall conductive film.

8. The capacitor as claimed in claim 5, further comprising a silicon nitride film over said inter-layer insulator and wherein said vertically extending column portion comprises a vertically extending center layer extending both through and over said inter-layer insulator and a side wall conductive film extending both through and over said silicon nitride film and said side wall conductive film surrounding said vertically extending center layer.

* * * * *